United States Patent
Zhang

(10) Patent No.: US 11,133,324 B2
(45) Date of Patent: Sep. 28, 2021

(54) VERTICAL MEMORY DEVICES

(71) Applicant: Yangtze Memory Technologies Co., Ltd., Wuhan (CN)

(72) Inventor: Zhong Zhang, Wuhan (CN)

(73) Assignee: Yangtze Memory Technologies Co., Ltd., Wuhan (CN)

(*) Notice: Subject to any disclaimer, the term of this patent is extended or adjusted under 35 U.S.C. 154(b) by 25 days.

(21) Appl. No.: 16/684,830

(22) Filed: Nov. 15, 2019

(65) Prior Publication Data
US 2021/0057429 A1 Feb. 25, 2021

Related U.S. Application Data

(63) Continuation of application No. PCT/CN2019/102306, filed on Aug. 23, 2019.

(51) Int. Cl.
| | |
|---|---|
| *H01L 27/11556* | (2017.01) |
| *H01L 27/11519* | (2017.01) |
| *H01L 27/11524* | (2017.01) |
| *H01L 27/11565* | (2017.01) |
| *H01L 27/1157* | (2017.01) |
| *H01L 27/11582* | (2017.01) |

(52) U.S. Cl.
CPC .... *H01L 27/11556* (2013.01); *H01L 27/1157* (2013.01); *H01L 27/11519* (2013.01); *H01L 27/11524* (2013.01); *H01L 27/11565* (2013.01); *H01L 27/11582* (2013.01)

(58) Field of Classification Search
CPC ......... H01L 27/11556; H01L 27/11582; H01L 27/11524; H01L 27/11565; H01L 27/1157; H01L 27/11519
See application file for complete search history.

(56) References Cited

U.S. PATENT DOCUMENTS

2012/0061744 A1* 3/2012 Hwang ............. H01L 27/11573
257/324
2014/0015057 A1 1/2014 Lee et al.
(Continued)

FOREIGN PATENT DOCUMENTS

| CN | 105304637 A | 2/2016 |
|---|---|---|
| CN | 106098693 A | 11/2016 |

(Continued)

OTHER PUBLICATIONS

International Search Report and Written Opinion dated May 21, 2020 in PCT/CN2019/102306, 10 pages.

*Primary Examiner* — Allison Bernstein
(74) *Attorney, Agent, or Firm* — Oblon, McClelland, Maier & Neustadt, L.L.P.

(57) ABSTRACT

Aspects of the disclosure provide a semiconductor device. The semiconductor device includes gate layers and insulating layers that are stacked alternatingly along a direction perpendicular to a substrate of the semiconductor device in an array region upon the substrate. Further, the semiconductor device includes an array of channel structures that is formed in the array region. The gate layers and the insulating layers are stacked in a staircase form with stair steps having non-uniform stair depths in a connection region upon the substrate. Further, the semiconductor device includes contact structures to the gate layers. The contact structures are formed on the stair steps that have the non-uniform stair depths.

20 Claims, 11 Drawing Sheets

(56) References Cited

U.S. PATENT DOCUMENTS

2016/0372322 A1   12/2016  Oh et al.
2017/0200676 A1*  7/2017  Jeong ................ H01L 27/11556
2019/0148506 A1   5/2019  Kanakamedala et al.

FOREIGN PATENT DOCUMENTS

| CN | 107039457 A | 8/2017 |
| CN | 109427803 A | 3/2019 |
| CN | 109496356 A | 3/2019 |
| CN | 109983577 A | 7/2019 |

* cited by examiner

VERTICAL MEMORY DEVICES

RELATED APPLICATION

This application is a bypass continuation of International Application No. PCT/CN2019/102306, filed on Aug. 23, 2019. The entire disclosure of the prior application is hereby incorporated by reference in its entirety.

BACKGROUND

Semiconductor manufactures developed vertical device technologies, such as three dimensional (3D) NAND flash memory technology, and the like to achieve higher data storage density without requiring smaller memory cells. In some examples, a 3D NAND memory device includes a core region and a staircase region. The core region includes a stack of alternating gate layers and insulating layers. The stack of alternating gate layers and insulating layers is used to form memory cells that are stacked vertically. The staircase region includes the respective gate layers in the stair-step form to facilitate forming contacts to the respective gate layers. The contacts are used to connect driving circuitry to the respective gate layers for controlling the stacked memory cells.

SUMMARY

Aspects of the disclosure provide a semiconductor device. The semiconductor device includes gate layers and insulating layers that are stacked alternatingly along a direction perpendicular to a substrate of the semiconductor device in an array region upon the substrate. Further, the semiconductor device includes an array of channel structures that is formed in the array region. The gate layers and the insulating layers are stacked in a staircase form with stair steps having non-uniform stair depths in a connection region upon the substrate. Further, the semiconductor device includes contact structures to the gate layers. The contact structures are formed on the stair steps that have the non-uniform stair depths.

In some embodiments, the stair steps include a first stair step with a first depth that is about half of a second depth of a second stair step.

In some embodiments, the contact structures to a group of consecutive gate layers are formed respectively on the stair steps having non-uniform stair depths.

According to an aspect of the disclosure, the stair steps include risers that are parallel to slit structures that divide the array of channel structures into finger portions. In some embodiments, the stair steps include at least one riser disposed between neighboring slit structures. In some examples, the stair steps include first risers that are substantially aligned with the slit structures and at least a second riser of the stair steps that is disposed between neighboring slit structures.

In some embodiments, first slit structures in the array region have substantially a same pitch as second slit structures in the connection region. In some examples, the first slit structures divide the channel structures in the array region into three finger portions, and the stair steps are configured to have a first depth being equal to the pitch, and a second depth being half of the pitch. In an example, the stair steps include two steps having the first depth, and include two steps having the second depth. In another example, the stair steps include one step having the first depth, and include four steps having the second depth.

Aspects of the disclosure provide a method for forming a semiconductor device. The method includes stacking sacrificial gate layers and insulating layers alternatingly along a direction perpendicular to a substrate of the semiconductor device in an array region and a connection region upon the substrate. Then, the method includes forming the sacrificial gate layers and the insulating layers in the connection region into a staircase form with stair steps having non-uniform stair depths. Further, the method includes forming channel structures in the array region, replacing the sacrificial gate layers with gate layers, and forming contact structures on the stair steps.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
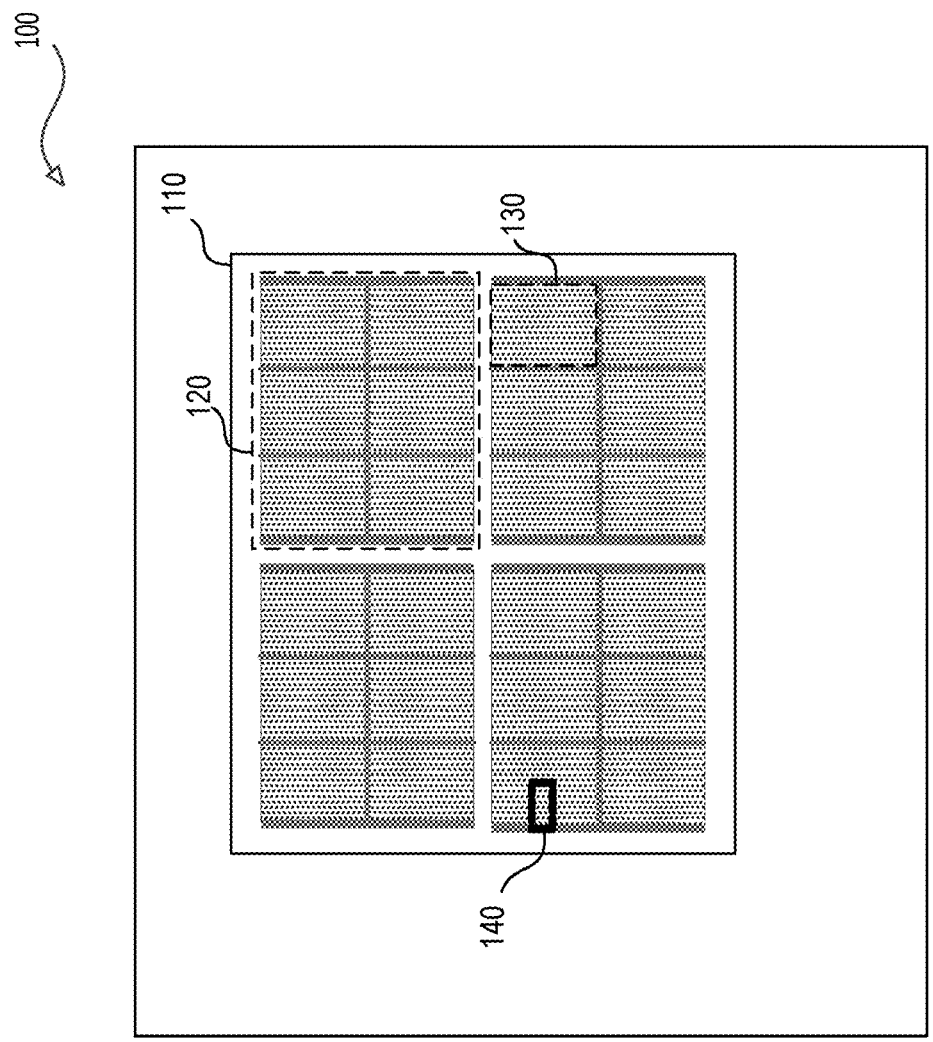
FIG. 1 shows a top-down view of a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Three-dimensional (3D) semiconductor memory devices can be formed on a substrate that includes an array region (also referred to as core region in some examples) for forming an array of memory cells and a connection region for forming connections to the memory cells. For example, the memory cells are formed in the array region as an array of vertical memory cell strings. The vertical memory cell strings are formed of gate layers and insulating layers that are stacked alternatingly. At the connection region, the stack of gate layers and the insulating layers are patterned into stair steps to provide contact pads for connecting the gate layers to word lines.

Various fabrication technologies, such as gate-first fabrication technology, gate-last fabrication technology, and the like are developed to fabricate vertical memory devices. The gate-first fabrication technology forms gates of memory cells earlier than channels of the memory cells. The gate-last fabrication technology uses sacrificial gate layers to facilitate the formation of channels for memory cells; and replaces the sacrificial gate layers with real gates for the memory cells after the formation of the channels. The replacement of the sacrificial gates with the real gates includes a removal of the sacrificial gate layers, and then a formation of the real gates. To remove the sacrificial gate layers, in some examples, slit structures are formed in a stack of sacrificial gate layers and insulating layer. The slit structures are parallel and are disposed in both the array region and the connection region. The slit structures divide the array of vertical memory cell strings into portions of finger shapes, and the portions are referred to as fingers, finger structures or finger portions in the present disclosure.

Generally, stair steps are formed of treads and risers. In an example, a tread is the part that is disposed horizontally between a top edge of a lower riser and a bottom edge of an upper riser, and a riser is the part that is disposed vertically between an inner edge of a lower tread and an outer edge of an upper tread. The tread is the part that can be configured into a contact pad for one or more contact structures to land on. The riser is the sidewall of a stack of layers, such as alternatingly disposed (sacrificial) gate layers and insulating layers. In some examples, a stair step is composed of a tread and a lower riser of the tread. The stair step is measured by depth and width of the tread and height of the lower riser. The depth of the tread is the distance from the outer edge to the inner edge of the tread. The width of the tread is the distance from one side of the tread to the other side. The height of the riser is the vertical distance of the sidewall between the lower tread and the current tread. In the present disclosure, the height of the riser can be measured in term of layer pairs. For example, a layer pair is a thickness sum of a (sacrificial) gate layer and an insulating layer. In some examples, when a stair step has a height of multiple layer pairs, such as four layer pairs, five layer pairs, six layer pairs, the stair step is referred to as a group step; when a stair step has a height of one layer pair, the stair step is referred to as a division step.

According to some aspects of the disclosure, division steps can have different depths. In some examples, the division steps are disposed with the risers being parallel to the slit structures. For example, some risers of the division steps are disposed between slit structures, and some risers of the division steps are disposed overlapping with the slit structures. Thus, in some embodiments, the depth of some division steps equals to the pitch of the slit structures, and the depth of some other division steps equals to half of the pitch of the slit structures. The pitch of the slit structures is measured as the distance between the center lines of neighboring slit structures in an example.

FIG. 1 shows a top-down view of a semiconductor device 100 according to some embodiments of the disclosure. The semiconductor device 100 includes a memory portion 110 that are formed of three-dimensional (3D) memory cells. The memory portion 110 can include one or more memory planes 120, and each of memory planes 120 can include a plurality of memory blocks 130. In some examples, concurrent operations can take place at the memory planes 120. In some embodiments, each of the memory blocks 130 is the smallest unit to carry out erase operations. In the FIG. 1 example, the memory portion 110 includes four memory planes 120 and each of the memory planes 120 includes six memory blocks 130. Each of the memory blocks 103 can include a plurality of memory cells, and each memory cell can be addressed through interconnections, such as bit lines and word lines. In some examples, the bit lines and word lines can be laid out perpendicularly, forming an array of metal lines. For example, the word lines extend in the X direction, and the bit lines extend in the Y direction.

Further, each memory block 130 can be divided into block portions 140 according to stair division patterns. The block portions 140 have identical or equivalent stair division patterns. It is noted that the layout patterns for the stair division patterns of the block portions 140 can be identical patterns or can be mirrored patterns. The block portions 140 are referred to as stair division pattern (SDP) portions 140 in the following description. The details of the SDP portions will be described with reference to examples in FIG. 2-5.

It is noted that the semiconductor device 100 can be any suitable device, for example, memory circuits, a semiconductor chip (or die) with memory circuits formed on the semiconductor chip, a semiconductor wafer with multiple semiconductor dies formed on the semiconductor wafer, a stack of semiconductor chips, a semiconductor package that includes one or more semiconductor chips assembled on a package substrate, and the like.

It is also noted that, the semiconductor device 100 can include other suitable circuitry (not shown), such as logic circuitry, power circuitry, and the like that is formed on the same substrate, or other suitable substrate, and is suitably coupled with the memory portion 110. Generally, the memory portion 110 includes the memory cells and peripheral circuitry (e.g., address decoder, driving circuits, sense amplifier and the like).

Figure 2:
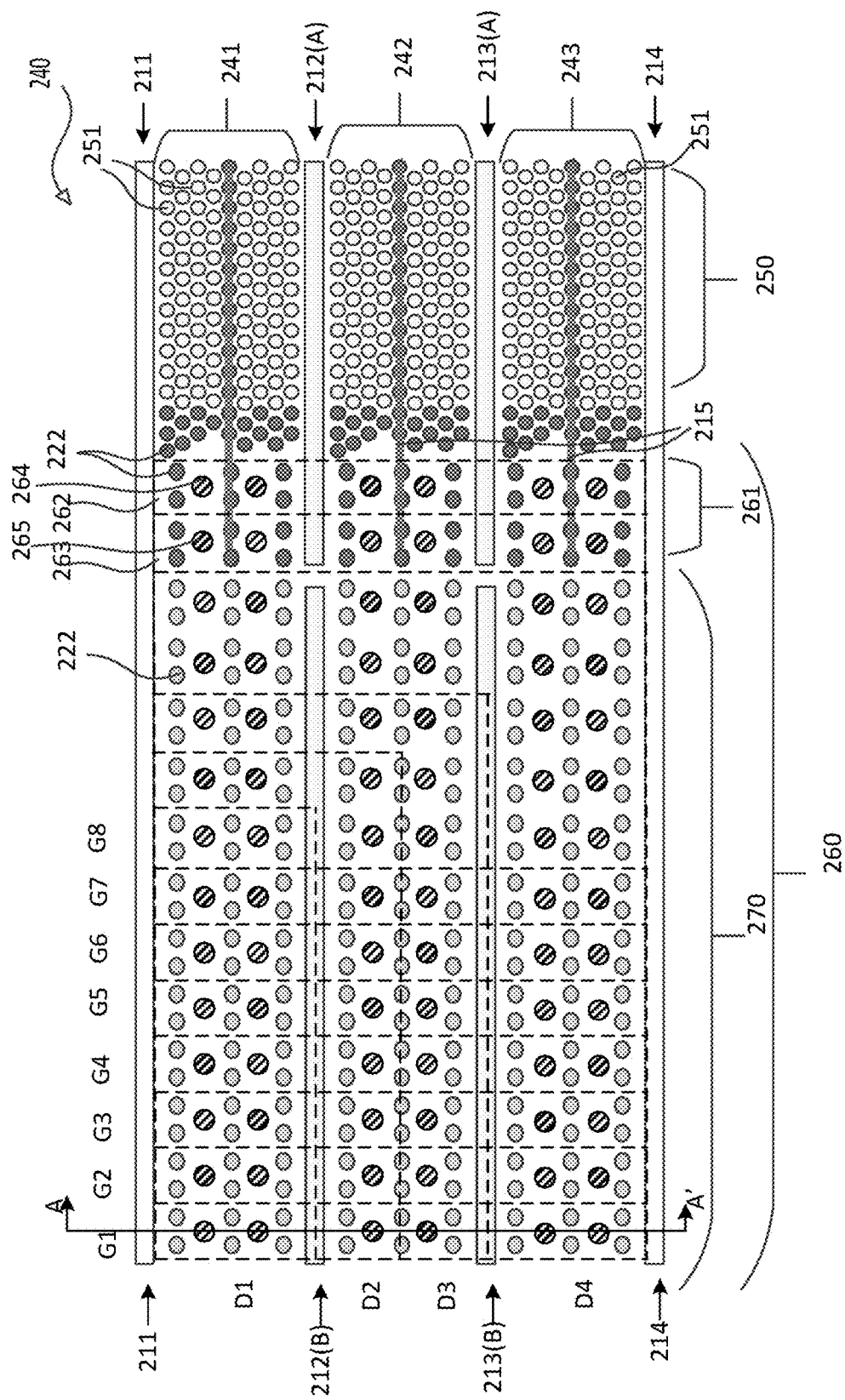
FIG. 2 shows a top-down view of a stair division pattern example according to some embodiments of the disclosure.
Figure 3:
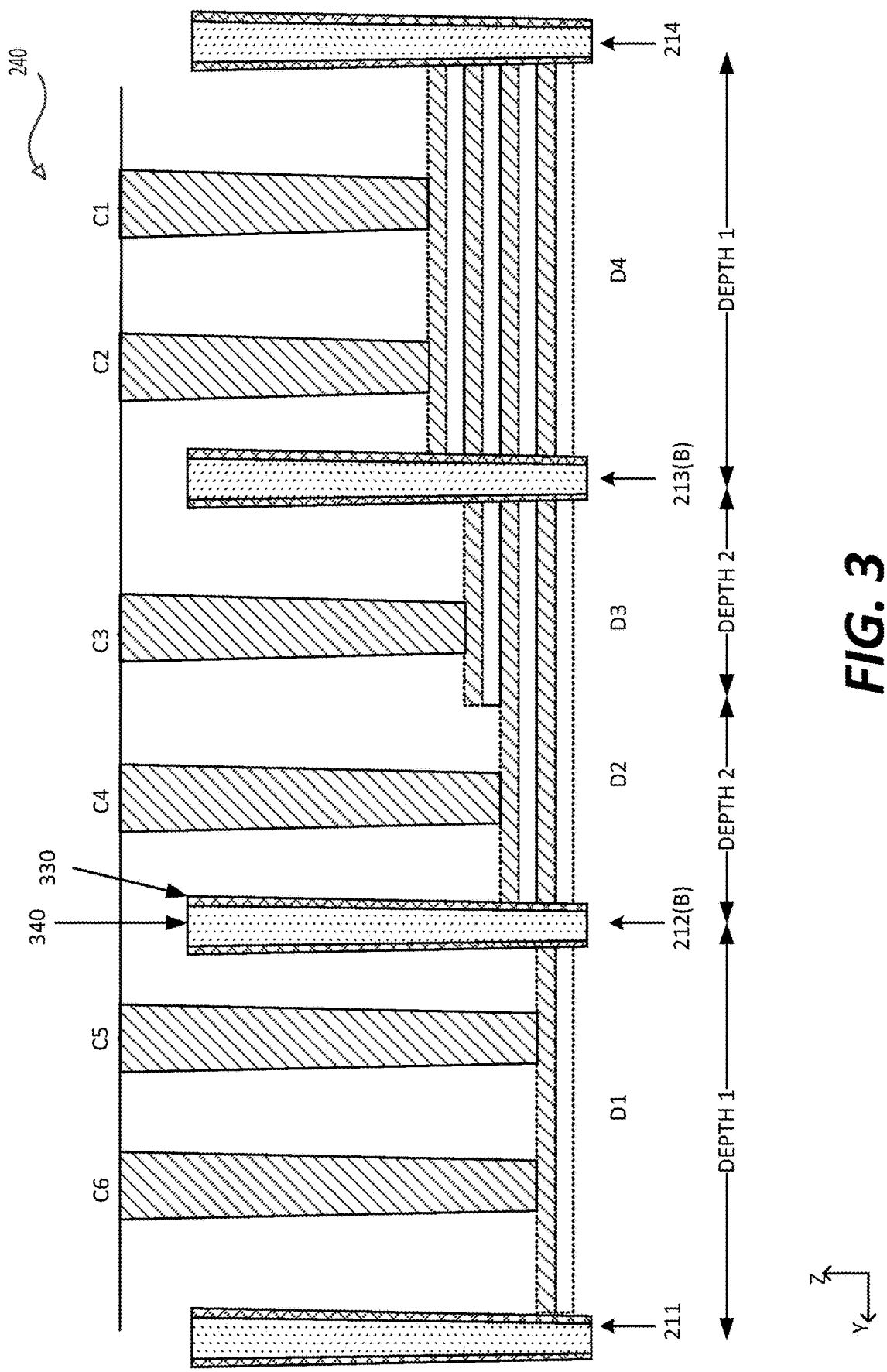
FIG. 3 shows a cross-sectional view of a stair division pattern example according to some embodiments of the disclosure.

FIG. 2 shows a top-down view of an SDP portion 240 according to some embodiments of the disclosure, FIG. 3 shows a cross-sectional view of the SDP portion 240 at line A-A'. In an example, the SDP portion 240 is an example for the SDP portion 140 in FIG. 1. The SDP portion 240 includes an array region 250 and a connection region 260. The array region 250 includes an array of memory strings 251, and each memory string 251 includes a plurality of stacked memory cells connected in series with one or more top select transistors and one or more bottom select transistors. The connection region 260 includes a top select gate (TSG) connection region 261, a memory cell gate (MCG) connection region 270. The TSG connection region 261 includes a staircase structure and contact structures for connecting metal wires to the gates of the top select transistors to control the top select transistors. The MCG connection region 270 includes staircase structures and contact structures for connecting word lines to the gates of the memory cells.

It is noted that, the connection region 260 may also include a bottom select gate (BSG) connection region (not shown) that includes a staircase structure and contact structures for connecting metal wires to the gates of the bottom select transistors to control the bottom select transistors.

In some embodiments, the gate-last fabrication technology is used, thus slit structures are formed to assist the removal of sacrificial gate layers, and the formation of the real gates. In the FIG. 2 and FIG. 3 example, slit structures 211, 212(A), 212(B), 213(A), 213(B) and 214 are formed. The slit structures 211, 212(A), 212(B), 213(A), 213(B) and 214 extend in the X direction, and parallel to each other. The slit structures 211 and 214 separate the SDP portion 240 from neighboring SDP portions. The slit structures 212(A) and 213(A) are disposed in the array region 250 and can divide the array of memory cell strings in the SDP portion 240 into three fingers 241, 242 and 243. The slit structures 212(B) and 213(B) are disposed in the connection region 260 and can divide the connection region 260 into multiple portions.

In an example, the slit structures 211 and 214 are continuous slit structures that are filled with insulating layers to electrically insulate the gate layers of the SDP portion 240 from neighboring SDP portions.

In some examples, the number of the slit structures in the connection region 260 is same as the number of slit structures in the array region 250. In the FIG. 2 and FIG. 3 example, the slit structures 212(B) and 213(B) are aligned with the slit structures 212(A) and 213(A). However, the slit structures 212(B) and 213(B) are broken from the slit structures 212(A) and 213(A) and are not continuous parts of the slit structures 212(A) and 213(A), thus the gate layers in the three fingers 241-243 are connected.

It is noted, in another example, the slit structures 212(B) and 213(B) are not aligned with the slit structures 212(A) and 213(A). In another example, the number of slit structures in the connection region 260 is not the same as the number of slit structures in the array region 250.

In some embodiments, at least some slit structures can function as the common source contact for an array of memory strings 251 in the array regions 250.

In the FIG. 2 and FIG. 3 example, top select gate cuts 215 can be disposed in the middle of each finger to divide a top select gate (TSG) layer of the memory finger into two parts, and thereby can divide a memory finger into two separately programmable (read/write) pages. While erase operation of a 3D NAND memory can be carried out at memory block level, read and write operations can be carried out at memory page level. In some embodiments, dummy channel structures 222 can be disposed at suitable places for process variation control during fabrication and/or for additional mechanical support.

It is noted that, in some examples, the top select gate cuts 215 do not cut the memory cell gate layers and the bottom select gate layers.

In the TSG connection region 261, a stair structure is formed. The stair structure has multiple stair steps to expose a portion of gate layers of the top select transistors, and the exposed portions can be configured as contact pads. Then, contact structures can be formed on the contact pads for connecting metal wires to the gates of the top select transistors to control the top select transistors. In the FIG. 2 and FIG. 3 example, the stair structure has two stair steps 262 and 263. In an example, each of the two stair steps 262 and 263 has a height of one layer pair. In the FIG. 2 and FIG. 3 example, the dashed lines show edges of treads. In an example, a memory string includes a first gate select transistor and a second gate select transistor. The gate of the first gate select transistor is connected with a contact structure 264 on the first stair step 262, and the gate of the second gate select transistor is connected with a contact structure 265 on the second stair step 263.

In the MCG connection region 270, a multi-level stair structure is formed. In some embodiments, the multi-level stair structure includes a section level, a group level and a division level. The present disclosure uses one section to illustrate features of the group level and division level. It is noted that that features in the present disclosure can be respectively used in sections at the section level. In some embodiments, in a section, a two-level stair structure is used. In the FIG. 2 and FIG. 3 example, the two-level stair structure has a total of 32 layer pairs. The 32 layer pairs are grouped into eight groups. Then, each group includes four layer pairs. The two-level stair structure has group steps G1-G8 that go up in a first direction, such as in X direction. Further, each group step region includes a stair structure has division steps D1-D4 that go up in a second direction, such as −Y direction.

It is noted that, in the FIG. 2 and FIG. 3 example, the region of the group step G8 includes a stair structure with division steps that go up in both X and −Y directions, the regions of the group step G1-G7 respectively includes a stair structure with division steps that go up in −Y direction.

In the FIG. 2 and FIG. 3 example, the two-level stair structure exposes a portion of gate layers of the memory cells as contact pads, and contact structures can be formed on the contact pads to connect the gate layers of the memory cells to word lines. In an example, the first 32 memory cells next to the top select transistors in a string are referred to as M1-M32 in sequence with M1 being the first memory cell next to the top select transistor. Then, the tread of division step D4 in the region of group step G8 provides contact pad for M1. The tread of division step D3 in the region of group step G8 provides contact pad for M2. The tread of division step D2 in the region of group step G8 provides contact pad for M3. The tread of division step D1 in the region of group step G8 provides contact pad for M4.

Further, the tread of division step D4 in the region of group step G7 provides contact pad for M5. The tread of division step D3 in the region of group step G7 provides contact pad for M6. The tread of division step D2 in the region of group step G7 provides contact pad for M7. The tread of division step D1 in the region of group step G7 provides contact pad for M8.

Similarly, the tread of division step D4 in the region of group step G6 provides contact pad for M9. The tread of division step D3 in the region of group step G6 provides contact pad for M10. The tread of division step D2 in the region of group step G6 provides contact pad for M11. The tread of division step D1 in the region of group step G6 provides contact pad for M12.

Similarly, the tread of division step D4 in the region of group step G5 provides contact pad for M13. The tread of division step D3 in the region of group step G5 provides contact pad for M14. The tread of division step D2 in the region of group step G5 provides contact pad for M15. The tread of division step D1 in the region of group step G5 provides contact pad for M16.

Similarly, the tread of division step D4 in the region of group step G4 provides contact pad for M17. The tread of division step D3 in the region of group step G4 provides contact pad for M18. The tread of division step D2 in the region of group step G4 provides contact pad for M19. The tread of division step D1 in the region of group step G4 provides contact pad for M20.

Similarly, the tread of division step D4 in the region of group step G3 provides contact pad for M21. The tread of division step D3 in the region of group step G3 provides contact pad for M22. The tread of division step D2 in the region of group step G3 provides contact pad for M23. The tread of division step D1 in the region of group step G3 provides contact pad for M24.

Similarly, the tread of division step D4 in the region of group step G2 provides contact pad for M25. The tread of division step D3 in the region of group step G2 provides contact pad for M26. The tread of division step D2 in the region of group step G2 provides contact pad for M27. The tread of division step D1 in the region of group step G2 provides contact pad for M28.

Similarly, the tread of division step D4 in the region of group step G1 provides a contact pad for M29, and contact structures C1 and C2 (shown in FIG. 3) are formed on the contact pad. The tread of division step D3 in the region of group step G1 provides a contact pad for M30, and a contact structure C3 (shown in FIG. 3) is formed on the contact pad. The tread of division step D2 in the region of group step G1 provides a contact pad for M31, a contact structure C4 (shown in FIG. 3) is formed on the contact pad. The tread of division step D1 in the region of group step G1 provides contact pad for M32, and contact structures C5 and C6 (shown in FIG. 3) are formed on the contact pad.

In the FIG. 2 and FIG. 3 example, the depth (as shown by depth 1 in FIG. 3) of the division step D1 and D4 equals to the pitch of the slit structures, and the depth (as shown by depth 2 in FIG. 3) of the division steps D2 and D3 equals to half of the pitch of the slit structures.

It is noted that, in some examples, slit structures, such as shown by the slit structures 211, 212(B), 213(B) and 214 in FIG. 3 are filled with an insulating layer 330, and a conductive material 340. The insulating layer 330 insulates the conductive material 340 from the gate layers. The conductive material 340 can be used for forming common source contact.

According to an aspect of the disclosure, when the number of divisions (e.g., the number of division steps in a group step) in the connection region is larger than number of fingers in the array region, non-uniform depths of division steps can be used, thus there is no need to increase slit structures in the connection region, and layout can be designed with ease and with enough space for contact structures placement.

Figure 4:
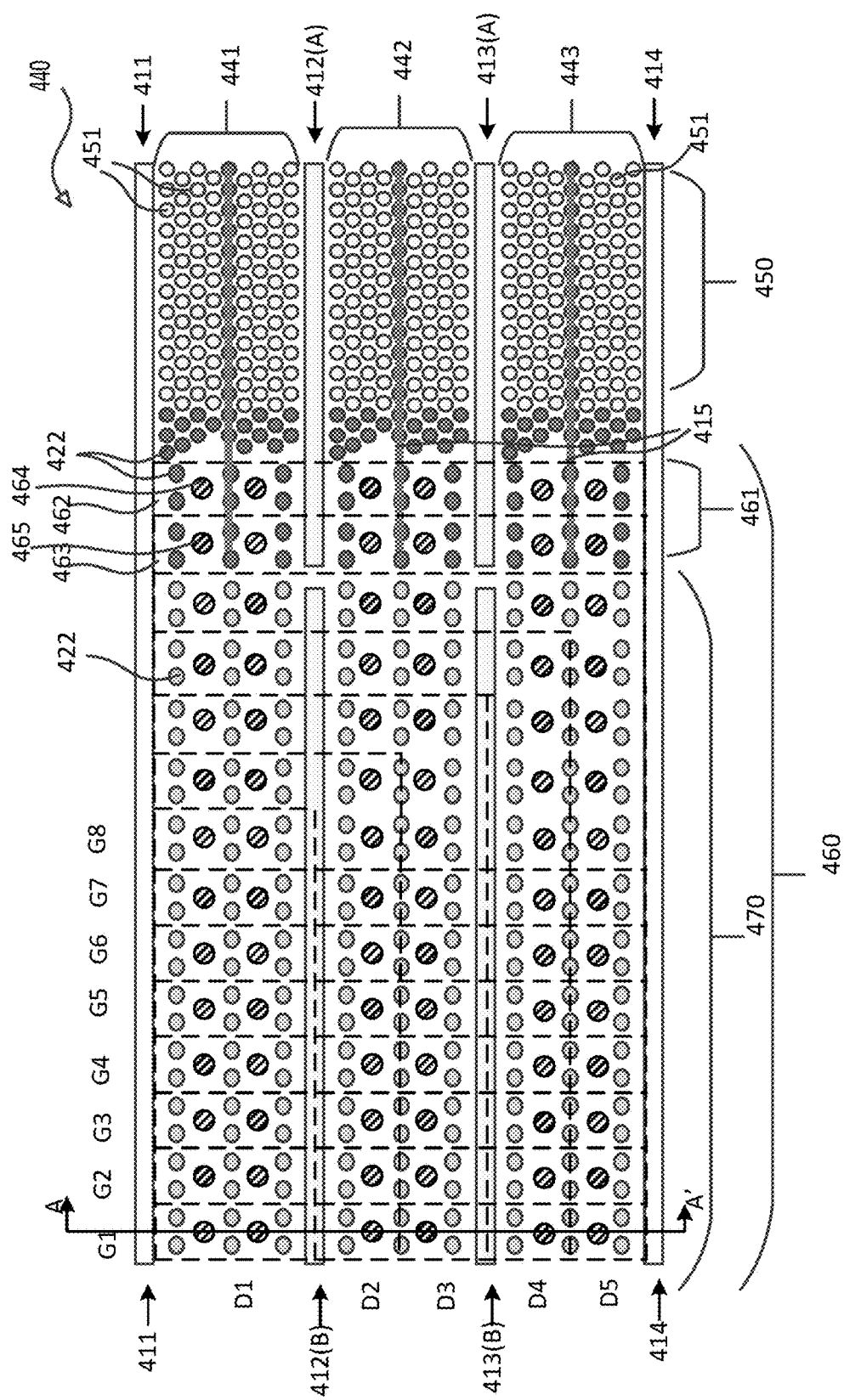
FIG. 4 shows a top-down view of another stair division pattern example according to some embodiments of the disclosure.
Figure 5:
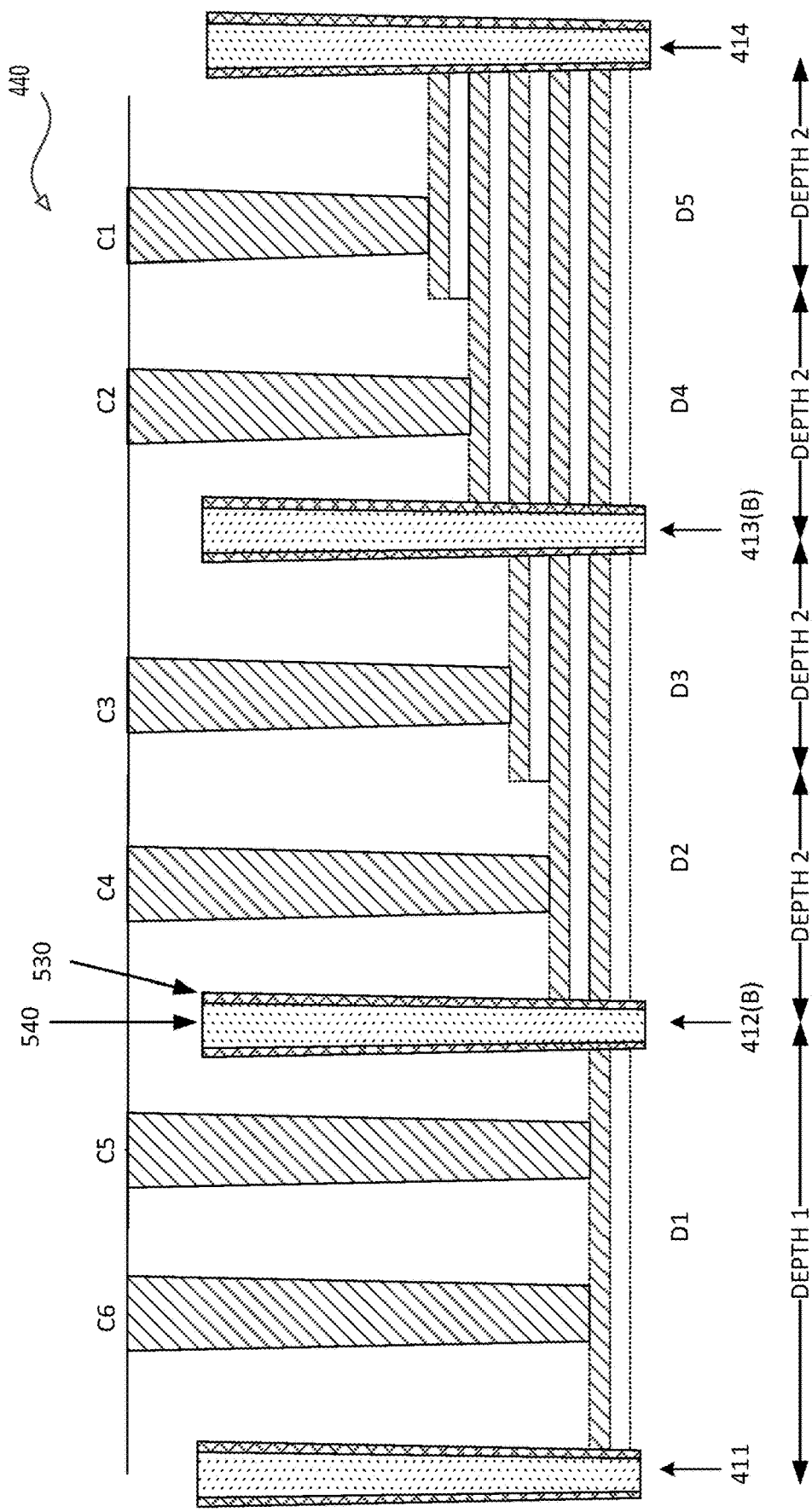
FIG. 5 shows a cross-sectional view of another stair division pattern portion example according to some embodiments of the disclosure.

FIG. 4 shows a top-down view of an SDP portion 440 according to some embodiments of the disclosure, FIG. 5 shows a cross-sectional view of the SDP portion 440 at line A-A'. In an example, the SDP portion 440 is an example for the SDP portion 140 in FIG. 1. The SDP portion 440 includes an array region 450 and a connection region 460. The array region 450 includes an array of memory strings 451, and each memory string 451 includes a plurality of stacked memory cells connected in series with one or more top select transistors and one or more bottom select transistors. The connection region 460 includes a top select gate (TSG) connection region 461, a memory cell gate (MCG) connection region 470. The TSG connection region 461 includes a staircase structure and contact structures for connecting metal wires to the gates of the top select transistors to control the top select transistors. The MCG connection region 470 includes staircase structures and contact structures for connecting word lines to the gates of the memory cells.

It is noted that, the connection region 460 may also include a bottom select gate (BSG) connection region (not shown) that includes a staircase structure and contact structures for connecting metal wires to the gates of the bottom select transistors to control the bottom select transistors.

In some embodiments, the gate-last fabrication technology is used, thus slit structures are formed to assist the removal of sacrificial gate layers, and the formation of the real gates. In the FIG. 4 and FIG. 5 example, slit structures 411, 412(A), 412(B), 413(A), 413(B) and 414 are formed. The slit structures 411, 412(A), 412(B), 413(A), 413(B) and 414 extend in the X direction, and parallel to each other. The slit structures 411 and 414 separate the SDP portion 440 from neighboring SDP portions. The slit structures 412(A) and 413(A) are disposed in the array region 450 and can divide the array of memory cell strings in the SDP portion 440 into three fingers 441, 442 and 443. The slit structures 412(B) and 413(B) are disposed in the connection region 460 and can divide the connection region 460 into multiple portions.

In an example, the slit structures 411 and 414 are continuous slit structures with insulating layers to electrically insulate the gate layers of the SDP portion 440 from neighboring SDP portions.

In some examples, the number of the slit structures in connection region 460 is same as the number of slit structures in the array region 450. In the FIG. 4 and FIG. 5 example, the slit structures 412(B) and 413(B) are aligned with the slit structures 412(A) and 413(A). However, the slit structures 412(B) and 413(B) are broken from the slit structures 412(A) and 413(A) and are not continuous parts of the slit structures 412(A) and 413(A), thus the gate layers in the three fingers 441-443 are connected.

It is noted, in another example, the slit structures 412(B) and 413(B) are not aligned with the slit structures 412(A) and 413(A). In another example, the number of slit structures in the connection region 460 is not the same as the number of slit structures in the array region 450.

In some embodiments, at least some slit structures can function as the common source contact for an array of memory strings 451 in the array regions 450.

In the FIG. 4 and FIG. 5 example, top select gate cuts 415 can be disposed in the middle of each finger to divide TSG layer(s) of the memory finger into two parts, and thereby can divide a memory finger into two separately programmable (read/write) pages. While erase operation of a 3D NAND memory can be carried out at memory block level, read and write operations can be carried out at memory page level. In some embodiments, dummy channel structures 422 can be disposed at suitable places for process variation control during fabrication and/or for additional mechanical support.

It is noted that, in some examples, the top select gate cuts 415 do not cut the memory cell gate layers and the bottom select gate layers.

In the TSG connection region 461, a stair structure is formed. The stair structure has multiple stair steps to expose a portion of gate layers of the top select transistors as contact pads. Then, contact structures can be formed on the contact pads for connecting metal wires to the gates of the top select transistors to control the top select transistors. In the FIG. 4 and FIG. 5 example, the stair structure has two stair steps 462 and 463. In an example, each of the two stair steps 462 and 463 has a height of one layer pair. In the FIG. 4 and FIG. 5 example, the dashed lines show edges of treads. In an example, a memory string includes a first gate select transistor and a second gate select transistor. The gate of the first gate select transistor is connected with a contact structure 464 on the first stair step 462, and the gate of the second gate select transistor is connected with a contact structure 465 on the second stair step 463.

In the MCG connection region 470, a multi-level stair structure is formed. In some embodiments, the multi-level stair structure includes a section level, a group level and a division level. The present disclosure uses one section to illustrate features of the group level and division level. It is noted that that features in the present disclosure can be respectively used in sections at the section level. In some embodiments, in a section, a two-level stair structure is used. In the FIG. 4 and FIG. 5 example, the two-level stair structure has a total of 40 layer pairs. The 40 layer pairs are grouped into eight groups. Then, each group includes five layer pairs. The two-level stair structure has group steps G1-G8 that go up in a first direction, such as in X direction. Further, each group step region includes a stair structure has division steps D1-D5 that go up in a second direction, such as -Y direction.

It is noted that, in the FIG. 4 and FIG. 5 example, the region of the group step G8 includes a stair structure with division steps that go up in both X and -Y directions, the regions of the group steps G1-G7 respectively includes a stair structure with division steps that go up in -Y direction.

In the FIG. 4 and FIG. 5 example, the two-level stair structure exposes a portion of gate layers of the memory cells as contact pads, and contact structures can be formed on the contact pads to connect the gate layers of the memory cells to word lines. In an example, the first 40 memory cells next to the top select transistors in a string are referred to as M1-M40 in sequence with M1 being the first memory cell next to the top select transistor. Then, the tread of division step D5 in the region of group step G8 provides contact pad for M1. The tread of division step D4 in the region of group step G8 provides contact pad for M2. The tread of division step D3 in the region of group step G8 provides contact pad for M3. The tread of division step D2 in the region of group step G8 provides contact pad for M4. The tread of division step D1 in the region of group step G8 provides contact pad for M5.

Further, the tread of division step D5 in the region of group step G7 provides contact pad for M6. The tread of division step D4 in the region of group step G7 provides contact pad for M7. The tread of division step D3 in the region of group step G7 provides contact pad for M8. The tread of division step D2 in the region of group step G7 provides contact pad for M9. The tread of division step D1 in the region of group step G7 provides contact pad for M10.

Similarly, the tread of division step D5 in the region of group step G6 provides contact pad for M11. The tread of division step D4 in the region of group step G6 provides contact pad for M12. The tread of division step D3 in the region of group step G6 provides contact pad for M13. The tread of division step D2 in the region of group step G6 provides contact pad for M14. The tread of division step D1 in the region of group step G6 provides contact pad for M15.

Similarly, the tread of division step D5 in the region of group step G5 provides contact pad for M16. The tread of division step D4 in the region of group step G5 provides contact pad for M17. The tread of division step D3 in the region of group step G5 provides contact pad for M18. The tread of division step D2 in the region of group step G5 provides contact pad for M19. The tread of division step D1 in the region of group step G5 provides contact pad for M20.

Similarly, the tread of division step D5 in the region of group step G4 provides contact pad for M21. The tread of division step D4 in the region of group step G4 provides contact pad for M22. The tread of division step D3 in the region of group step G4 provides contact pad for M23. The tread of division step D2 in the region of group step G4 provides contact pad for M24. The tread of division step D1 in the region of group step G4 provides contact pad for M25.

Similarly, the tread of division step D5 in the region of group step G3 provides contact pad for M26. The tread of division step D4 in the region of group step G3 provides contact pad for M27. The tread of division step D3 in the region of group step G3 provides contact pad for M28. The tread of division step D2 in the region of group step G3 provides contact pad for M29. The tread of division step D1 in the region of group step G3 provides contact pad for M30.

Similarly, the tread of division step D5 in the region of group step G2 provides contact pad for M31. The tread of division step D4 in the region of group step G2 provides contact pad for M32. The tread of division step D3 in the region of group step G2 provides contact pad for M33. The tread of division step D2 in the region of group step G2 provides contact pad for M34. The tread of division step D1 in the region of group step G2 provides contact pad for M35.

Similarly, the tread of division step D5 in the region of group step G1 provides a contact pad for M36, and a contact structure C1 (as shown in FIG. 5) is formed on the contact pad to connect the gate of M36 to a word line. The tread of division step D4 in the region of group step G1 provides a contact pad for M37, and a contact structure C2 (as shown in FIG. 5) is formed on the contact pad. The tread of division step D3 in the region of group step G1 provides a contact pad for M38, and a contact structure C3 (as shown in FIG. 5) is formed on the contact pad. The tread of division step D2 in the region of group step G1 provides a contact pad for M39, a contact structure C4 (as shown in FIG. 5) is formed on the contact pad. The tread of division step D1 in the region of group step G1 provides contact pad for M40, and contact structures C5 and C6 (as shown in FIG. 5) are formed on the contact pad.

In the FIG. 4 and FIG. 5 example, the depth (as shown by depth 1 in FIG. 5) of the division step D1 equals to the pitch of the slit structures, and the depth (as shown by depth 2 in FIG. 5) of the division steps D2, D3, D4 and D5 equals to half of the pitch of the slit structures.

It is noted that, in some examples, slit structures, such as shown by the slit structures 411, 412(B), 413(B) and 414 in FIG. 5 are filled with an insulating layer 530, and a conductive material 540. The insulating layer 530 insulates the conductive material 540 from the gate layers. The conductive material 540 can be used for forming common source contact.

According to an aspect of the disclosure, when the number of divisions (e.g., the number of division steps in a group step) in the connection region is larger than number of fingers in the array region, non-uniform depths of division steps can be used, thus there is no need to increase slit structures in the connection region, and layout can be designed with ease.

Figure 6:
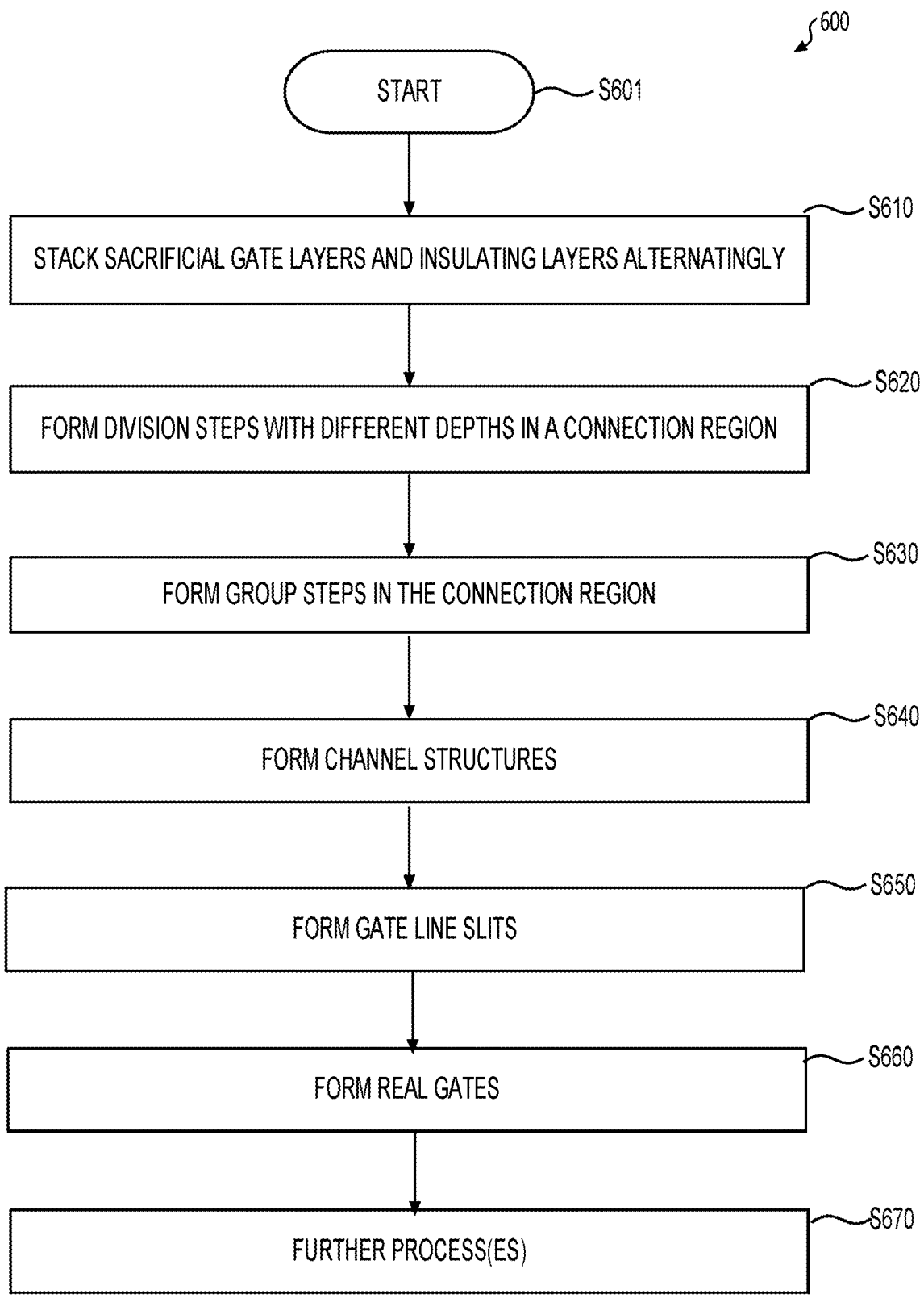
FIG. 6 shows a flow chart outlining a process example for fabricating a semiconductor device according to some embodiments of the disclosure.

FIG. 6 shows a flow chart outlining a process example 600 for fabricating a semiconductor device, such as the semiconductor device 100 according to some embodiments of the disclosure. The process starts at S601 and proceeds to S610.

At S610, sacrificial gate layers and insulating layers are stacked alternatingly on a substrate to form an initial stack. The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer. In some examples, the insulating layers are made of insulating material(s), such as silicon dioxide, and the like, and the sacrificial layers are made of silicon nitride.

At S620, division steps with non-uniform depth are formed in a connection region. In some examples, a mask layer is used and trimming process is applied on the mask layer to form the etch masks for forming the division steps.

Figure 7:
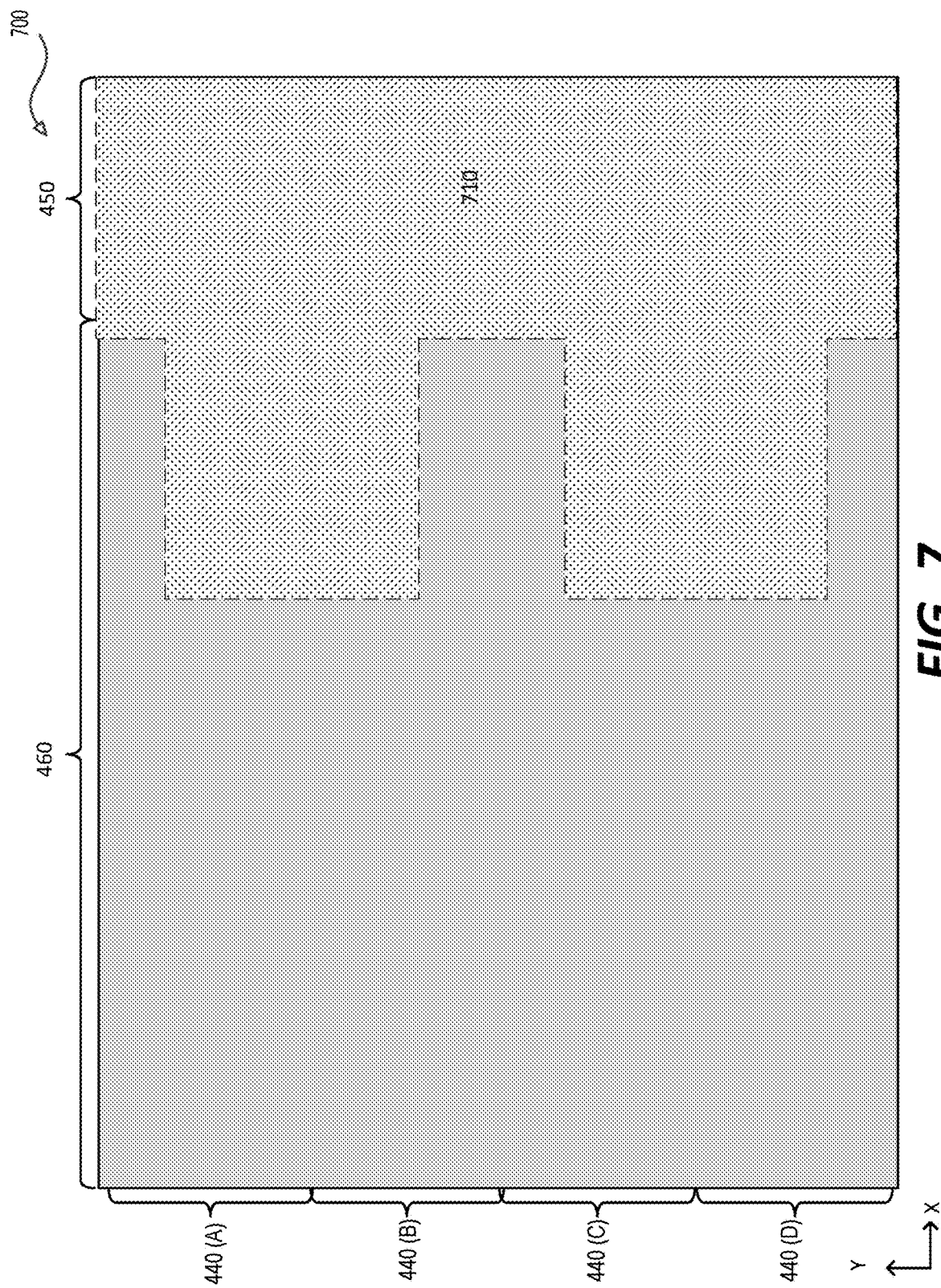
FIG. 7 shows an example of a top-down view of a semiconductor device covered by a mask layer according to some embodiments of the disclosure.

FIG. 7 shows an example of top-down view of a semiconductor device 700 with SDP portions 440 (A)-(D) that are covered by a mask layer 710. The mask layer 710 is used to form the division steps in the SDP portions 440 (A)-(D). The SDP portions 440 (A)-(D) are identical to the SDP portion 440 or mirrored of the SDP portion 440. The mask layer 710 covers the array region 450 and a portion of the connection region 460 adjacent to the array region 450. In some embodiments, the mask layer 710 can include a photoresist or carbon-based polymer material, and can be formed using a patterning process such as lithography. In some embodiments, the mask layer 710 can also include a hard mask, such as silicon oxide, silicon nitride, TEOS, silicon-containing anti-reflective coating (SiARC), amorphous silicon, or polycrystalline silicon. The hard mask can be patterned using etching process such as reactive-ion-etching (RIE) using O2 or CF4 chemistry. Furthermore, the mask layer 710 can include any combination of photoresist and hard mask.

In some embodiments, the division steps can be formed by applying a repetitive etch-trim process using the mask layer. The etch-trim process includes an etching process and a trimming process. During the etching process, a portion of the initial stack with exposed surface can be removed. In an example, the etch depth equals to a layer pair that is the thickness of a sacrificial gate layer and an insulating layer. In an example, the etching process for the insulating layer 450 can have a high selectivity over the sacrificial layer, and/or vice versa.

In some embodiments, the etching of the stack is performed by an anisotropic etching such as a reactive ion etch (RIE) or other dry etch processes. In some embodiments, the insulating layer is silicon oxide. In this example, the etching of silicon oxide can include RIE using fluorine based gases such as carbon-fluorine (CF4), hexafluoroethane (C2F6), CHF3, or C3F6 and/or any other suitable gases. In some embodiments, the silicon oxide layer can be removed by wet chemistry, such as hydrofluoric acid or a mixture of hydrofluoric acid and ethylene glycol. In some embodiments, a timed-etch approach can be used. In some embodiments, the sacrificial layer is silicon nitride. In this example, the etching of silicon nitride can include RIE using O2, N2, CF4, NF3, C12, HBr, BCl3, and/or combinations thereof. The methods and etchants to remove a single layer stack should not be limited by the embodiments of the present disclosure.

The trimming process includes applying a suitable etching process (e.g., an isotropic dry etch or a wet etch) on the mask layer 710 such that the mask layer 710 can be pulled back (e.g., shrink inwardly) laterally in the x-y plane from edges. In some embodiments, the trimming process can include dry etching, such as RIE using O2, Ar, N2, etc. In some embodiments, a pull-back distance of the mask layer 710 corresponds to the depth of a division step. In an embodiment, pull-back distances are suitably controlled to result in different depths of the division steps. For example, in a first cycle of etch-trim process, the trimming time for the mask layer 710 is suitably controlled to pull back a distance that is about the pitch of slit structures; and in a second cycle of etch-trim process, the trimming time for the mask layer 710 is suitably controlled to pull back a distance that is about half of the pitch of the slit structures.

After trimming the mask layer 710, one portion of the topmost level of the initial stack corresponding to a division is exposed and the other portion of the topmost level of the initial stack remains covered by the mask layer 710. The next cycle of etch-trim process resumes with the etching process.

In some embodiments, the topmost level of the initial stack can be covered by an insulating layer. In some embodiments, the topmost level of the initial stack can further be covered by other dielectric materials. A process step of removing the insulating layer and/or the other dielectric materials can be added to the etching process of each etch-trim cycle to form the division steps.

After forming the division steps, the mask layer 710 can be removed. The mask layer 710 can be removed by using techniques such as dry etching with O2 or CF4 plasma, or wet etching with resist/polymer stripper, for example solvent based chemicals.

Figure 8:
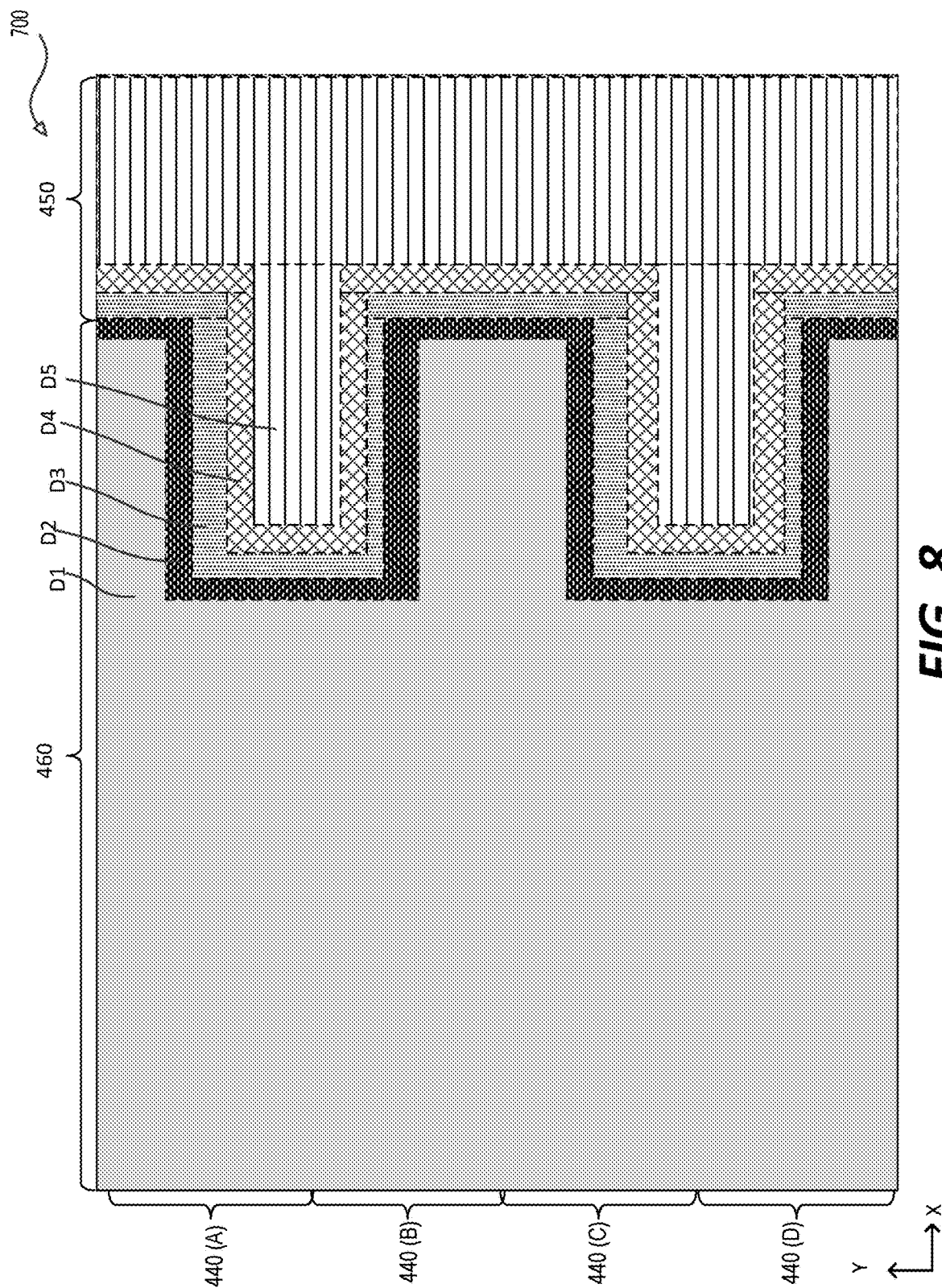
FIG. 8 shows an example of a top-down view of the semiconductor device when the mask layer is removed according to some embodiments of the disclosure.

FIG. 8 shows an example of top-down view of the semiconductor device 700 with SDP portions 440 (A)-(D) after the mask layer 710 is removed. As shown in FIG. 8, division steps D1-D5 are formed.

Referring back to FIG. 6, at S630, group steps in the connection region are formed. In some examples, a mask layer is used and trimming process is applied on the mask layer to form the etch masks for forming the group steps.

Figure 9:
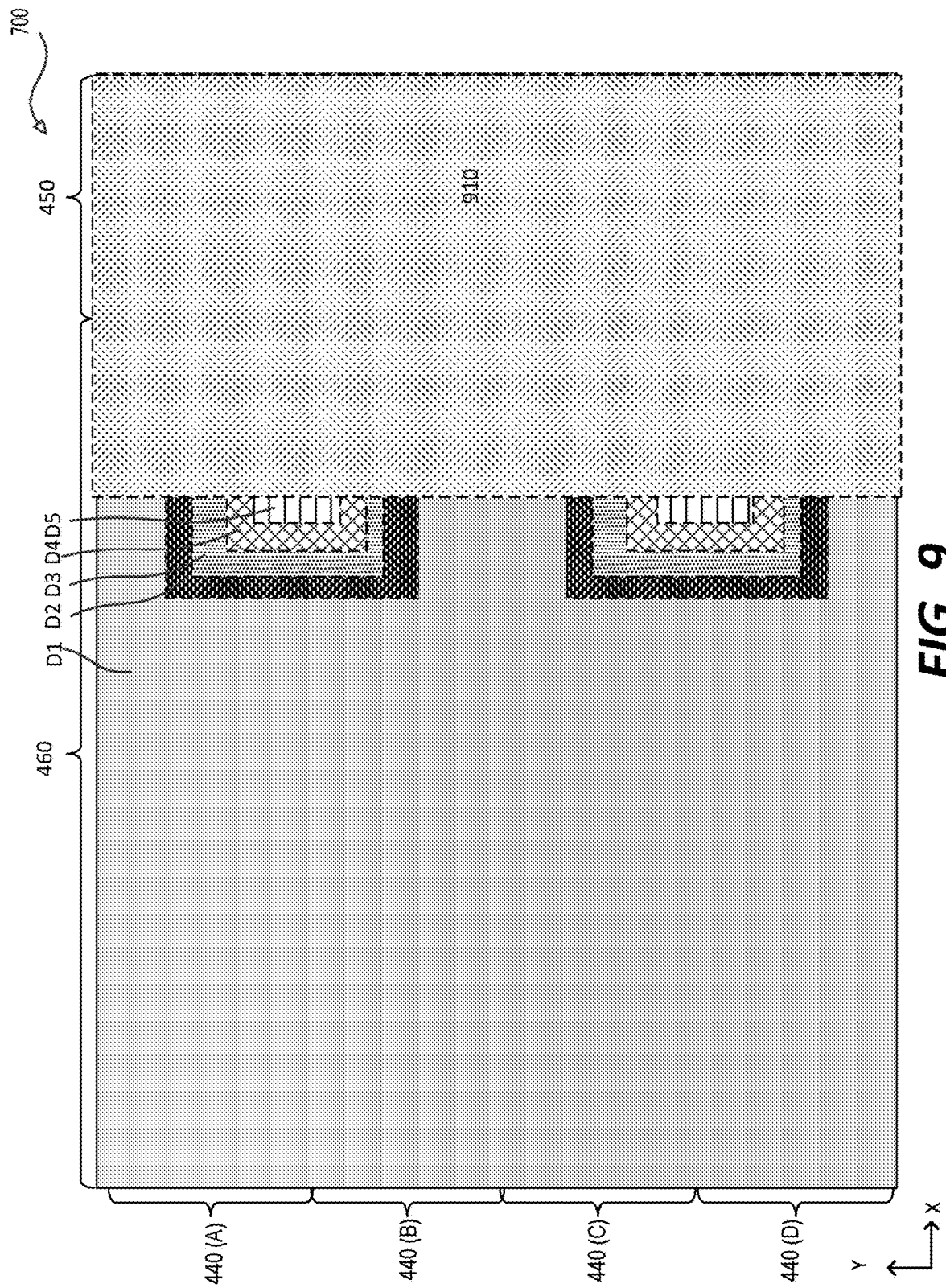
FIG. 9 shows an example of a top-down view of the semiconductor device covered by another mask layer according to some embodiments of the disclosure.

FIG. 9 shows an example of top-down view of the semiconductor device 700 with the SDP portions 440 (A)-(D) that is covered by a mask layer 910 that is used to form the group steps in the SDP portions 440 (A)-(D). The mask layer 910 is disposed over the array region 450 and a portion of the connection region 460. The mask layer 910 can be made of a similar material as the mask layer 710 and can be formed using a similar technique.

In some embodiments, the group steps can be formed by applying repetitive etch-trim process using the mask layer 910, similar to the repetitive etch-trim process to form the division steps. In this example, the group steps can be formed by trimming the mask layer 910 in X-direction.

In some embodiments, the trimming process determines a depth of a group step. In some embodiments, the group steps can have the same depth. In some embodiments, the group steps can have different depths.

In some embodiments, each group step includes multiple layer pairs, such as 5 layer pairs in the FIG. 9 examples. Then, an etching process etches suitable layers corresponding to the height of a group step, such as five layer pairs of alternating sacrificial layers and insulating layers.

After forming the group steps, the mask layer 910 can be removed. The mask layer 910 can be removed by using techniques such as dry etching with O2 or CF4 plasma, or wet etching with resist/polymer stripper, for example solvent based chemicals.

Figure 10:
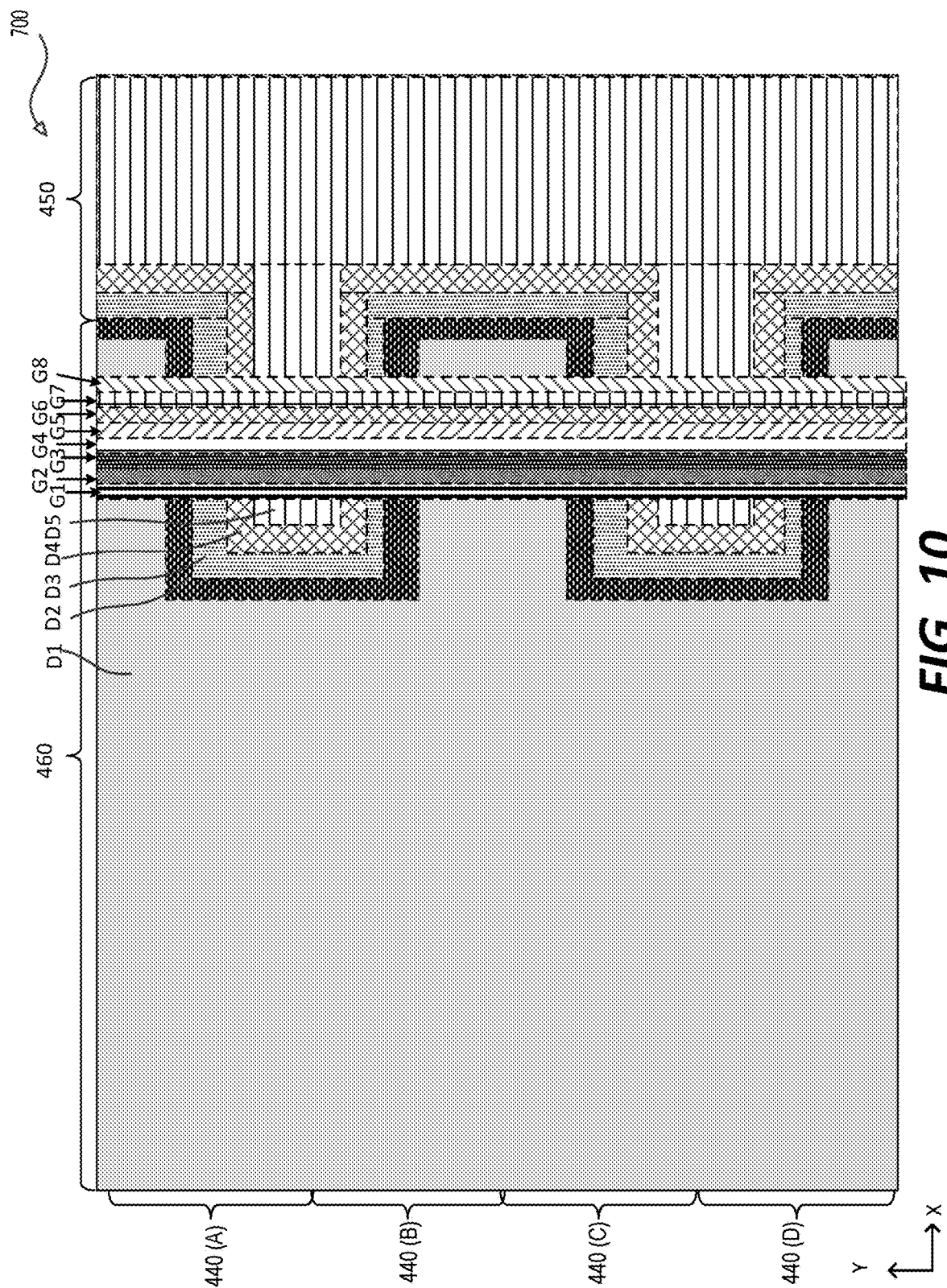
FIG. 10 shows an example of a top-down view of the semiconductor device when the other mask layer is removed according to some embodiments of the disclosure.

FIG. 10 shows an example of top-down view of the semiconductor device 700 with the SDP portions 440 (A)-(D) after the mask layer 910 is removed. As shown in FIG. 10, group steps G1-G8 and division steps D1-D5 are formed.

Figure 11:
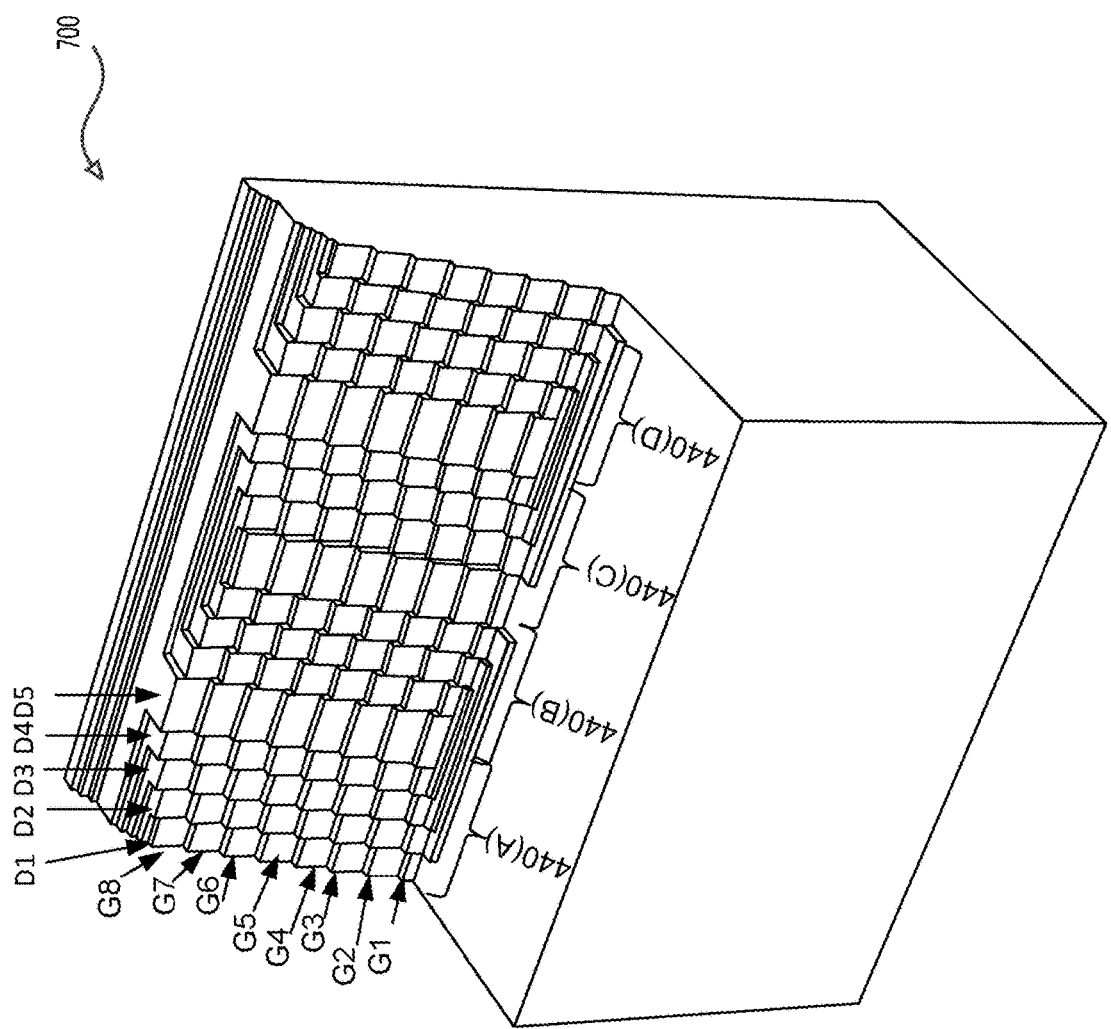
FIG. 11 shows an example of a perspective view of a semiconductor device according to some embodiments of the disclosure.

FIG. 11 shows an example of a perspective view of the semiconductor device 700 with the SDP portions 440 (A)-(D) after the mask layer 910 is removed. As shown in FIG. 11, group steps G1-G8 and division steps D1-D5 are formed.

Referring back to S640, channel structures are formed. In an example, suitably planarization process is performed to obtain a relatively flat surface. Then, photo lithography technology is used to define patterns of channel holes and dummy channel holes in photoresist and/or hard mask layers, and etch technology is used to transfer the patterns into the stack of sacrificial layers and insulating layers. Thus, channel holes are formed in the array region 110 and the dummy channel holes are formed in the connection region.

Then, channel structures are formed in the channel holes, and dummy channel structures are formed in the dummy channel holes. In some embodiments, dummy channel structures can be formed with the channel structures, thus the dummy channel structures are formed of the same materials as the channel structures. In some embodiments, the dummy channel structures are formed differently from the channel structures.

At S650, gate line slits (also referred to as slit structures in some examples) are formed. In some embodiments, the gate line slits are etched as trenches in the stack. In some examples, the gate line slits in the connection region have the same pitch as the gate line slits in the array region.

At S660, real gates are formed. In some embodiments, using the gate line slits, the sacrificial layers can be replaced by the gate layers. In an example, etchants to the sacrificial layers are applied via the gate line slits to remove the sacrificially layers. In an example, the sacrificial layers are made of silicon nitride, and the hot sulfuric acid ($H_2SO_4$) is applied via the gate line slits to remove the sacrificial layers. Further, via the gate line slits, gate stacks to the transistors in the array region are formed. In an example, a gate stack is formed of a high-k dielectric layer, a glue layer and a metal layer. The high-k dielectric layer can include any suitable material that provide the relatively large dielectric constant, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), and the like. The glue layer can include refractory metals, such as titanium (Ti), tantalum (Ta) and their nitrides, such as TiN, TaN, W2N, TiSiN, TaSiN, and the like. The metal layer includes a metal having high conductivity, such as tungsten (W), copper (Cu) and the like.

At S670, further process(es) can be performed on the semiconductor device. For example, the gate-last process continues to, for example, fill the gate line slits with spacer material (e.g., silicon oxide) and common source material (e.g., tungsten) to form the slit structure. Further, contacts structures can be formed and metal traces can be formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   gate layers and insulating layers that are stacked alternatingly along a first direction perpendicular to a substrate of the semiconductor device in an array region upon the substrate;
   an array of channel structures being formed in the array region;
   the gate layers and the insulating layers being stacked in a staircase form with stair steps having non-uniform stair depths in a second direction of a connection region of memory cells upon the substrate based on a number of the stair steps in the second direction of the connection region being greater than a number of finger portions in the array region; and
   contact structures to the gate layers being formed on the stair steps that have the non-uniform stair depths.

2. The semiconductor device of claim 1, wherein the stair steps include a first stair step with a first depth that is about half of a second depth of a second stair step.

3. The semiconductor device of claim 1, wherein the contact structures to a group of consecutive gate layers are formed respectively on the stair steps having non-uniform stair depths.

4. The semiconductor device of claim 1, wherein the stair steps include risers that are parallel to slit structures that divide the array of channel structures into the finger portions.

5. The semiconductor device of claim 4, wherein the stair steps include at least one riser disposed between neighboring slit structures.

6. The semiconductor device of claim 4, wherein the stair steps include first risers that are substantially aligned with the slit structures and at least a second riser of the stair steps that is disposed between neighboring slit structures.

7. The semiconductor device of claim 4, wherein first slit structures in the array region have substantially a same pitch as second slit structures in the connection region.

8. The semiconductor device of claim 7, wherein the first slit structures divide the channel structures in the array region into three finger portions, and the stair steps are configured to have a first depth being equal to the pitch, and a second depth being half of the pitch.

9. The semiconductor device of claim 8, wherein the stair steps include two steps having the first depth, and include two steps having the second depth.

10. The semiconductor device of claim 8, wherein the stair steps include one step having the first depth, and include four steps having the second depth.

11. A method for forming a semiconductor device, comprising:
    stacking sacrificial gate layers and insulating layers alternatingly along a first direction perpendicular to a substrate of the semiconductor device in an array region and a connection region upon the substrate;

forming the sacrificial gate layers and the insulating layers in the connection region into a staircase form with stair steps having non-uniform stair depths in a second direction of the connection region of memory cells based on a number of the stair steps in the second direction of the connection region being greater than a number of finger portions in the array region;

forming channel structures in the array region;

replacing the sacrificial gate layers with gate layers; and forming contact structures on the stair steps.

12. The method of claim 11, wherein forming the sacrificial gate layers and the insulating layers in the connection region into the staircase form with the stair steps having the non-uniform stair depths further comprises:

forming the stair steps including a first stair step with a first depth that is about half of a second depth of a second stair step.

13. The method of claim 11, wherein forming the contact structures on the stair steps further comprises:

forming the contact structures respectively on the stair steps having non-uniform stair depths, the contact structures being connected to a group of consecutive gate layers of the gate layers.

14. The method of claim 11, further comprising:

forming slit structures that divide the array region into the finger portions, risers of the stair steps being parallel to the slit structures.

15. The method of claim 14, wherein the stair steps include at least one riser disposed between two neighboring slit structures.

16. The method of claim 14, wherein the stair steps include first risers that are substantially aligned with the slit structures, and at least a second riser of the stair steps that is disposed between two neighboring slit structures.

17. The method of claim 14, wherein first slit structures in the array region have substantially a same pitch as second slit structures in the connection region.

18. The method of claim 17, wherein the first slit structures divide the channel structures in the array region into three finger portions, and the stair steps have a first depth that is equal to the pitch, and have a second depth that is half of the pitch.

19. The method of claim 18, wherein the stair steps include two steps having the first depth, and include two steps having the second depth.

20. The method of claim 18, wherein the stair steps include one step having the first depth, and include four steps having the second depth.

* * * * *